(12) United States Patent
Epstein et al.

(10) Patent No.: US 6,235,414 B1
(45) Date of Patent: May 22, 2001

(54) COLOR VARIABLE BIPOLAR/AC LIGHT-EMITTING DEVICES

(75) Inventors: Arthur J. Epstein, Bexley; Yunzhang Wang, Columbus, both of OH (US)

(73) Assignee: The Ohio State University Research Foundation, Columbus, OH (US)

( * ) Notice: Subject to any disclaimer, the term of this patent is extended or adjusted under 35 U.S.C. 154(b) by 0 days.

(21) Appl. No.: 09/038,226

(22) Filed: Mar. 11, 1998

Related U.S. Application Data
(60) Provisional application No. 60/036,679, filed on Mar. 11, 1997.

(51) Int. Cl.[7] .................................................. H05B 33/14
(52) U.S. Cl. ...................... 428/690; 428/917; 313/504; 313/506; 257/40; 257/89; 257/103
(58) Field of Search ..................... 313/504, 506; 428/212, 690, 917; 257/40, 89, 90, 94, 96, 103

(56) References Cited

U.S. PATENT DOCUMENTS

| | | | |
|---|---|---|---|
| 3,734,597 | 5/1973 | Churchill et al. | 350/160 LC |
| 3,873,185 | 3/1975 | Rogers | 350/147 |
| 4,704,559 | 11/1987 | Suginoya et al. | 315/169.1 |
| 5,554,450 | 9/1996 | Shi et al. | 428/690 |
| 5,597,890 | 1/1997 | Jenekhe | 528/397 |
| 5,601,903 | 2/1997 | Fujii et al. | 428/212 |
| 5,604,398 | 2/1997 | Zyung et al. | 313/506 |
| 5,663,573 * | 9/1997 | Epstein et al. | 257/40 |
| 5,698,858 | 12/1997 | Börner | 250/484.2 |
| 5,858,561 * | 1/1999 | Epstein et al. | 428/690 |

OTHER PUBLICATIONS

Article entitled: Exciplex emission in bilayer polymer light–emitting devices by D.D. Gebler, et al., published Mar. 31, 1997, pp. 1644–1646, Appl. Phys. Lett. 70(13).

Article entitled Organic electroluminescent diodes by C.W. Tang and S.A. VanSlyke, published Sep. 21, 1987, pp. 913–915, Appl. Phys. Lett. 51(12).

Article entitled Alternating–current light–emitting devices based on conjugated polymers by Y.Z. Wang et al., published Feb. 12, 1996, pp. 894–896, Appl. Phys. Lett. 68(7).

Article entitled Excited–State Complexes of Conjugated Polymers by Samson A. Jenekhe, dated 1995, pp. 309–311, Adv. Mater., vol. 7, No. 3 (no month).

Article entitled Polyaniline as a transparent electrode for polymer light–emitting diodes: Lower operating voltage efficiency, by Y. Yang and A. J. Heeger, published Mar. 7, 1994, pp. 1245–1247, Appl. Phys. Lett. 64(10).

Article entitled Electroluminescence of pure poly(N–vinylcarbazole) and its blends with a multiblock copolymer by B. Hu, Z. Yang, and F. E. Karasz, published Aug. 15, 1994, pp. 2419–2422, J. Appl. Phys. 76 (4).

Article entitled Blue electroluminescent diodes utilizing blends of poly(p–phenylphenylene vinylene) in poly (9–vinylcarbazole) by C. Zhang et al., published 1994, pp. 35–40, Synthetic Metals, 62. (no month).

Article entitled Microcavity Effect in a Single–Layer Polymer Light–Emitting Diode by Hermann F. Wittmann et al., published 1995, pp. 541–544, Adv. Mater., vol. 7, No. 6. (no month).

(List continued on next page.)

*Primary Examiner*—Marie R. Yamnitzky
(74) *Attorney, Agent, or Firm*—Standley & Gilcrest LLP

(57) ABSTRACT

Color-variable light-emitting devices which are capable of generating two independent colors, even at room temperature. The devices comprise a layer of at least one active electroluminescent polymer. This electroluminescent polymer may be accompanied by one or two redox-mediating polymer layers. The redox polymer layer(s) modify the charge injection and transport properties such that the device may be operated under both forward and reverse bias.

28 Claims, 8 Drawing Sheets-

OTHER PUBLICATIONS

Article entitled: "Plastic" lasers: Comparison of gain narrowing with a soluble semiconducting polymer in waveguides and microcavities, by Maria A. Diaz–Garcia et al., published Jun. 16, 1997, pp. 3191–3193, Appl. Phys. Lett 70 (24).

Article entitled Plastic lasers: Semiconducting polymers as a new class of solid–state laser materials, by Maria A. Diaz–Garcia, 8 pages, source and publication date not given.

Article entitled Efficient blue polymer light–emitting diodes from a series of soluble poly(paraphenylene)s, by Y. Yang, Q. Pei, and A. J. Heeger, published Jan. 15, 1996, pp. 934–939, J. Appl. Phys. 79 (2).

Article entitled Excimers and Exciplexes of Conjugated Polymers by Samson A. Jenekhe and John A. Osaheni, published Aug. 5, 1994, pp. 765–768, Science, vol. 265.

Article entitled Poly(p–phenylenevinylene) light–emitting diodes: Enhanced electroluminescent efficiency through charge carrier confinement by A. R. Brown, et al., published Dec. 7, 1992, pp. 2793–2795, Appl. Phy. Lett. 61 (23).

Article entitled Efficient Blue Luminescence of a Conjugated Polymer Exciplex by John A. Osaheni and Samson A. Jenekhe, published Jan. 1, 1994, pp. 739–742, Macromolecules, vol. 27, No. 3.

Article entitled Cooperative Emission In $\pi$–conjugated Polymer Thin Films, by S.V. Frolov et al., 1–9, (7 pages, incomplete copy of article) Source and publication date not given.

Article entitled Light–emitting diodes based on conjugated polymers by J. H. Burroughes et al., published Oct. 11, 1990, pp. 539–541, Nature, vol. 37.

Article entitled Making light of polymers by Lewis Rothberg, published Oct. 11, 1990, pp. 518–519, Nature, vol. 37.

Article entitled Blue electroluminescent devices based on soluble poly(p–pyridine) by D. D. Gebler et al., published Sep. 15, 1995, pp. 1–3, J. Appl. Phys. 78 (6).

Article entitled Light–emitting devices based on pyridine–containing conjugated polymers by Y. Z. Wang et al., published 1997, pp. 1179–1182, Synthetic Metals 85. (no month).

Article entitled Organic Electroluminescent Devices Based on Polymeric Materials by Junji Kido, published Oct., 1994, pp. 350–355, TRIP vol. 2, No. 10.

Article entitled Photoluminescence in pyridine–based polymers: Role of aggregates by J. W. Blatchford et al., published Oct. 1, 1996, pp. 9180–9189, Physical Review B, vol. 54, No. 13.

Article entitled Conjugated polymer electroluminescence by D. D. C. Bradley, published 1993, pp. 401–415, Synthetic Metals 54.

Article entitled Carrier tunneling and device characteristics in polymer light–emitting diodes by I. D. Parker, published Feb. 1, 1994, pp. 1656–1666, J. Appl. Phys. 75 (3).

Article entitled Electronic Processes in Organic Crystals by Pope & Swenberg, pp. 738–739, Source and publication date not given.

Article entitled Polymer Light–Emitting Electrochemical Cells by Qibing Pei et al., published Aug. 25, 1995, pp. 1086–1088, Science vol. 269.

Article entitled Color–variable electroluminescence from multilayer polymer films by Maki Hamaguchi and Katsumi Yoshino, published Jul. 8, 1996, pp. 143–145, Appl. Phys. Lett. 69 (2).

Article entitled Voltage controlled two color light–emitting electrochemical cells by Yang Yang and Qibing Pei, published May 6, 1996 pp. 2708–2710, Appl. Phys. Lett. 68 (19).

Article entitled Light–emitting diodes with variable colours from polymer blends by M. Berggren et al., published Dec. 1, 1994, pp. 444,446, Nature, vol. 372.

\* cited by examiner (a)

(b)

(c)

(d)

COLOR VARIABLE BIPOLAR/AC LIGHT-EMITTING DEVICES

RELATED APPLICATION DATA

This application claims the benefit of U.S. provisional application No. 60/036,679 filed on Mar. 11, 1997, which is incorporated herein by reference.

TECHNICAL FIELD

This invention relates to light-emitting devices driven by an electric field and which are commonly referred to as electroluminescent devices.

BACKGROUND

In the past decade, there has been great interest in organic electroluminescent devices, particularly conjugated polymer based light-emitting devices ("LED"s). Electroluminescence ("EL") combined with other unique properties of polymers, such as solution processibility, band gap tunability, and mechanical flexibility, make conjugated polymers excellent candidates for low cost large area display applications.

Among the most important limitations associated with "conventional" polymer light-emitting diodes is poor stability and so-called "shelf lifetime." The devices degrade even during storage. This is usually caused by the chemical reactivity of the low work function metal electrodes required for efficient electron injection and/or by the poor oxygen stability of most conjugated polymers. Recently there have been reports of new device configurations such as symmetrically configured AC light-emitting ("SCALE") devices and light-emitting electrochemical cells ("LEC"s). These devices modify the charge injection and/or transport characteristics such that the device operation is not sensitive to the electrode materials used. As a consequence, more stable metals such as aluminum or even gold can be used as electrodes, potentially improving the device operating stability and storage lifetimes.

To date, a variety of conjugated polymers and/or copolymers have been found to exhibit electroluminescent properties such that all the necessary colors needed for display applications are obtainable.

However, for most devices the color of the emitted light is fixed once the device is fabricated. Recently there has been great interest in developing color variable light-emitting devices, i.e., individual devices that can generate two or more colors of light. In color variable devices based on blends of polythiophene derivatives, different components in the blend emit different colors of light simultaneously, with the strength of each component varying with the applied voltage. Such devices can emit multiple colors of light; however, such devices have very limited control over brightness at a desired color. Color variable light-emitting electrochemical cells which emit two independent colors of light also have been developed. The two-color LECs offer an improved control over the color and brightness: the color is controlled by the polarity and the brightness is controlled by the magnitude of the driving voltage. However, due to the involvement of ionic species in the device operation, the response of the devices is intrinsically slow, making them clearly unsuitable for applications that require rapid switching of colors. More recently, multilayer light emitting devices which generate two independent colors were achieved at liquid nitrogen temperature by inserting a blocking layer in between two different emitting polymer layers. The two colors can also be controlled by the polarity of the driving voltage. Such an approach improves the device response time, but it raises the device operating voltage due to the introduction of the charge blocking layer and retains the stability concerns of "conventional" polymer LEDs.

At present, most polymer-based LEDs can only be operated under forward DC bias, and require a low workfunction metal in the electron injecting contact. However, since low workfunction metals, such as calcium, are unstable against oxidation, such devices show very poor stability under ambient environment. Also, the conventional polymer LEDs generally only can emit one color of light, and it is not possible to tune the color of light once such LEDs have been fabricated.

The present invention thus is a further improvement upon the bipolar electroluminescent devices described in U.S. Pat. No. 5,663,573, which is incorporated herein by reference.

It is thus an object of the present invention to provide a color variable bipolar light emitting device that can be applied to a variety of display applications requiring a robust and reliable electroluminescent device.

SUMMARY OF THE INVENTION

The present invention includes color-variable light-emitting devices which are capable of generating two independent colors, even at room temperature. The devices comprise a layer of at least one active electroluminescent polymer sandwiched between two different redox-mediating polymer layers. The redox polymer layers modify the charge injection and transport properties such that the device may be operated under both forward and reverse bias. Also, at least one of the redox polymers is capable of modifying the emission properties of the emitting polymer layer at the interface such that the interface emits different colors of light than the bulk of the emitting polymer layer. Thus, the colors of the light may be controlled by selecting the desired emission locations which in turn may be controlled by the polarity of the driving voltage and the charge injection and transport properties of the emitting polymer layer. As movement of ionic species is not required for the device to operate, a relatively fast time response may be achieved, allowing colors to be changed rapidly.

The present invention includes polymer based color-variable bipolar("CVBP")/AC light-emitting devices, and their fabrication. The devices of the present invention may have either a single layer or a multi-layer structure. In the single layer structure, the device may be fabricated from a blend of conjugated polymers and/or copolymers as the emitting layer. In the multi-layer configuration, the device may be fabricated as a layer of emissive polymer or a blend of emissive polymers sandwiched between two non-emissive polymers, such as two different redox polymer layers. Indium-tin-oxide ("ITO") and metals may be used as charge injecting contacts in both configurations.

FIG. 1 shows schematically the structure of the devices of the present invention. The devices of the present invention may be fabricated by spin casting polymer layers on one electrode and then vacuum depositing the other electrode. The spin casting technique is conventional and well-known in the art. However, a wide variety of other well known methods may also be used to obtain the layered structure shown in FIG. 1 including doctor blading, dip coating, chemical vapor deposition, physical vapor evaporation, sputtering, and Langmuir-Blodgett techniques. Spin casting is preferred due to the ease of fabrication and uniformity of the resulting thin films.

The CVBP devices of the present invention may operate under either polarity of driving voltage with different colors of light being emitted under forward and reverse bias. The relative fast time response allows the rapid switch of colors and AC operation. The fundamental concept of the present invention is quite general, it is applicable to a variety of emitting materials in conjunction with suitable redox materials, as well as suitable electrode materials.

Electron-Injecting Electrodes

With respect to such alternative materials and referring to FIG. 1, the classical electron-injecting electrode 1 of either configuration (a), (b) or (c) may be of any appropriate material. The electrode materials may be metals, degenerate semiconductors, and conducting polymers. Electrodes can be fashioned from any suitable conductive material including electrode materials that may be metals, degenerate semiconductors, and conducting polymers. Examples of such materials include a wide variety of conducting materials including, but not limited to, (1) indium-tin-oxide ("ITO"), (2) metals such as gold, aluminum, calcium, silver, copper, indium and magnesium, (3) alloys such as magnesium-silver, (4) conducting fibers such as carbon fibers, and (5) highly-conducting organic polymers such as highly-conducting doped polyaniline, highly-conducting doped polypyrrole, or polyaniline salt (such as PAN-CSA) or other pyridyl nitrogen-containing polymer, such as polypyridylvinylene. Other examples may include materials that would allow the devices to be constructed as hybrid devices through the use of semiconductive materials, such as n-doped silicon, n-doped polyacetylene or n-doped polyparaphenylene.

In typical applications where the device is used for lighting and display, at least one of the electrodes may be fashioned from a transparent material such as indium tin oxide or a partially transparent material such as highly-conducting doped polyaniline. Partially transparent electrodes may be used to advantage to filter or clip unwanted portions (frequencies) of light coming from the light-emitting material.

It is noted that it is not necessary that the electrode material be transparent or even partially transparent. In cases where the electrode materials are opaque to the emitted light, light emission from the edge of the device may be utilized in, for example, coupling applications such as in coupling the device to an optical fiber. Since the devices of the present invention can be AC driven, it has the advantage of delivering modulated light output in frequency modulated or amplitude modulated form.

Substrate

For ease of manufacture and safety purposes, it is often desirable to form the device on a substrate which also serves to protect and often insulates (both physically and electrically) the device during use. The substrate layer may be any appropriate material; glass or clear electrically insulating plastic substrates are preferable when the device is used for lighting and display purposes. An AC driven device is especially suitable for light emission from both sides of the device in which case all of the insulating material and electrode materials are at least partially transparent as well as any protective substrates that may be used with one or both electrodes. The substrate layer is shown in FIG. 1 as substrate layer 2.

Hole-Injecting Electrodes

The classical hole-injecting electrode 3 of either configuration (a), (b) or (c) may be of any appropriate high work function material, such as indium-tin-oxide ("ITO"), gold (preferably transparent), or a polyaniline salt (such as PAN-CSA). Other electrode materials referred to as classical electron-injecting electrode materials may be used as the so-called hole-injecting electrode materials.

Other examples may include materials that would allow the devices to be constructed as hybrid devices through the use of semiconductive materials, such as p-doped silicon, p-doped polyacetylene or p-doped polyparaphenylene.

The Emissive Blend Layer

With respect to the single layer embodiment (a) in FIG. 1, the emissive layer of the single layer device (referred to in configuration (a) of FIG. 1 as the polymer blend 4 may be any blend of at least two polymers; one polymer having relatively greater electron transporting properties and the other having relatively greater hole transporting properties. The same emissive layer is shown in the multi-layer configurations (b) and (c) of FIG. 1, as emissive polymer(s) layer 5.

Representative polymer blends of the emissive polymer layer may be selected from several groups including, but are not limited to, conjugated and non-conjugated polymers and copolymers, including polypyridines, polypyridylvinylenes, polythiophenes, polyphenylenes, polyphenylenevinylenes, rigid-rod polymers such as polyphenylenebenzobisthiozoles, polyfluorenes, polyvinylcarbazoles, polythienylenevinylenes, and so on. A wide variety of specific materials (i.e., derivatives) can be found in each of these groups as a result of modifications to the basic structure. As an example, the emissive polymer layer may be a mixture of a polypyridylvinylene (i.e., having relatively greater electron transporting properties) and a polythiophene (i.e., having relatively greater hole transporting properties).

Both the emissive polymer(s) layer 5 (referred to in configuration (a) of FIG. 1 as the polymer blend 4) and redox polymer(s) layer 6 may be molecules, oligomers, polymer and copolymers with a variety of side groups, and blends of such above materials.

In an alternative embodiment, devices in accordance with the present invention may be constructed without a redox polymer as described in FIG. 1 as layer 6. Such devices have been shown to be operative. See FIG. 1(c) which otherwise bears the same reference numerals as FIG. 1 (b).

The emissive blend layer may also be fabricated from one or more such polymers together with at least one molecular dopant (i.e., a non-polymeric substance) having hole- or electron-transport capability, so as to be capable of affecting the hole- or electron-transporting character of the emissive layer, thus affecting the recombination zone of this emissive layer. Such molecular dopants also may be themselves light emissive under operative conditions. Examples of such materials include 8-hydroxy quinoline aluminum ($AlQ_3$) (electron transporting; light emissive), 2-(4-biphenylyl)-5-(4-tert-butylphenyl)-1,3,4-oxadiazole(PBD) (electron transporting; non-light emissive), N,N'-diphenyl-N,N'-bis(3-methylphenyl)-1,1'-biphenyl-4,4'-diamine(TPD) (hole-transporting), 4,4'-bis[N-(1-napthyl)-N-phenyl-amino] biphenyl (α-NPD).

The Redox Polymer Layer

Representative redox material groups may include emeraldine base (EB) forms of polyaniline, the sulfonated forms of the polyaniline ("SPAN"), and derivatives of these groups, and oligomers thereof. Salts of the sulfonated polyaniline, such as those formed with sodium hydroxide, may also be used. It is also noted that EB may have a range of imine unit concentration from 0.3 to 0.75 SPAN may have a range of sulfonation 0.20 to in excess of 100%.

The Acidic Redox Polymer Layer

The acidic redox polymer layer 7 may be any acidic polymer capable of functioning in an electron/hole transport role. For instance, this polymer layer may comprise sulfonated polyaniline (SPAN) oligomers thereof, or polymers containing acid groups (i.e., acidic polymers), or polymers doped with an acid. For instance, the acidic polymer may comprise toluene sulfonic acid either incorporated into the polymer itself or as a dopant of another polymer.

Use of the Devices with Reversible Current

It will be understood that the above-described components of the devices of the present invention are described in classical terms, such as electron-injecting and hole-injecting electrodes, when referring to the devices as being operated in the classical forward direction. However, it will be recognized that when operated in the reverse direction, the classic roles of the above-described components are reversed. Accordingly, it will also be recognized that the devices of the present invention may also be operated with electrodes of either classical type alone or both classical types.

The Source of Electrical Energy

The devices of the present invention may be operated by any appropriate source of electrical energy 8 shown in FIG. 1.

The light emitter of FIG. 1(a) is also in electrical contact with a first electrode and a second electrode as described above, with the first and second electrodes arranged in spaced relation with each other. The first electrode and the second electrode are electrically connected to a potential difference in either direction. That is, the first electrode can be connected to a positive potential (anode) while the second electrode is connected to a negative potential (cathode) or the connections can be reversed, with the first electrode connected to a negative potential while the second electrode is connected to a positive potential (opposite current direction). Because the device can be operated in either current direction with similar output efficiency, it allows the device to be driven with an alternating voltage, that is, the device preferably can be used with an alternating current.

The light emitter of FIG. 1(b) is in electrical contact with the polymeric layers 6 and 7 which are, respectively, in electrical contact with electrodes 3 and 1. The first and second electrodes are electrically connected to a potential difference as described above with respect to FIG. 1(a).

The light emitter of FIG. 1(c) is in electrical contact with polymeric layer 7 and electrode 3; polymeric layer 7 in turn being in electrical contact with electrode 1. The first and second electrodes are electrically connected to a potential difference as is described above with respect to FIG. 1 (a).

The electrodes 1 and 3 are connected to a voltage source 8 by means of suitable electrical connectors or contacts. Such electrical connectors and contacts are conventional in the art and may include wire leads, printed circuit connectors, spring clips, snaps, solder, wrapped posts, conducting glues, etc. It is also to be understood that the electrical connector or contact can be the electrodes 1 and 2 themselves. That is, the potential difference from voltage source 8 may be applied directly to the electrodes in which case electrodes 1 and 3 may become the electrical contact or connector.

Although not limited to the theory of its operation, it is believed that in devices such as in the configurations shown in FIGS. 1(b) and 1(c), when operated in the forward direction, electrons encounter holes at about the interface of the acidic polymer layer 7 and the emissive polymer layer 5 causing emission of, for instance, red light; and, when operated in the reverse direction, electrons encounter holes within the emissive polymer layer 5 causing emission of, for instance, green light.

The devices of the present invention may be constructed as shown in FIG. 1(b) wherein layers 6 and 7 are the same acid group-coating polyaniline materials. Such devices due to differences in fabrication processing steps, are still able to effect color variable operation. This is believed to be due to different degrees of acid doping of the emitting layer at the respective interface with each redox polymer layer.

The devices of the present invention may feature a relatively low turn-on and operating AC or DC voltage of less than about 24 volts. More preferably, a turn-on and operating voltage of less than about 12, less than about 6 volts, or even less than about 5 volts may been achieved. These low voltages make these devices particularly advantageous for use in toys, as commercial light strips such as found on airplanes and in theaters, as signs, and as flat panel displays for computer and television use.

The foregoing and other advantages of the invention will become apparent from the following disclosure in which one or more preferred embodiments of the invention are described in detail and illustrated in the accompanying drawings. It is contemplated that variations in procedures, processing, structural features, arrangement of parts, experimental design, ingredients, compositions, compounds, and elements may occur to a person skilled in the art without departing from the scope of or sacrificing any of the advantages of the invention.

DETAILED DESCRIPTION OF THE PREFERRED EMBODIMENTS

Figure 1A:
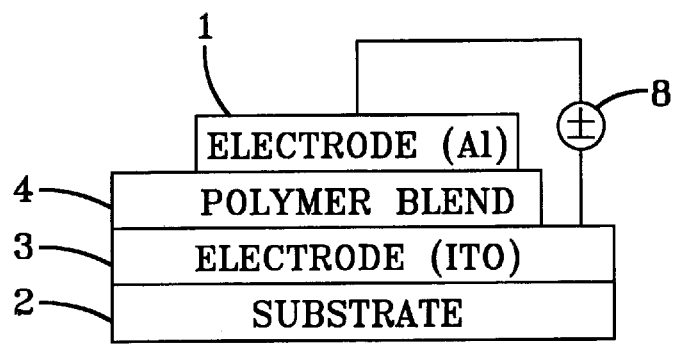
FIG. 1 is a general schematic of the color variable bipolar light emitting devices of the present invention, showing (a) single layer, (c) bilayer and (b) trilayer configurations.
Figure 1B:
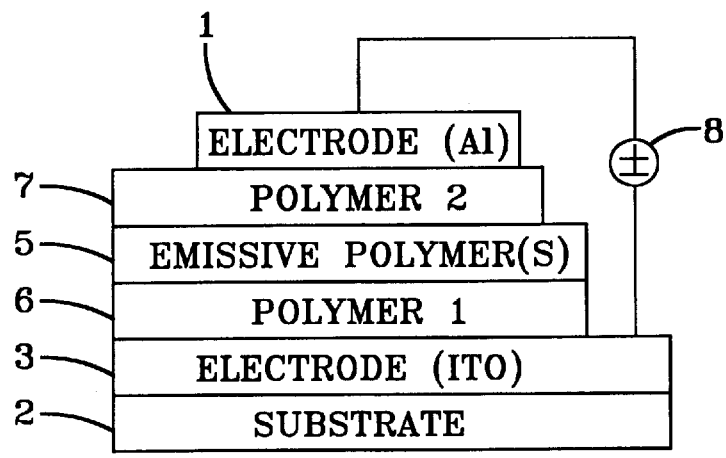
Figure 1C:
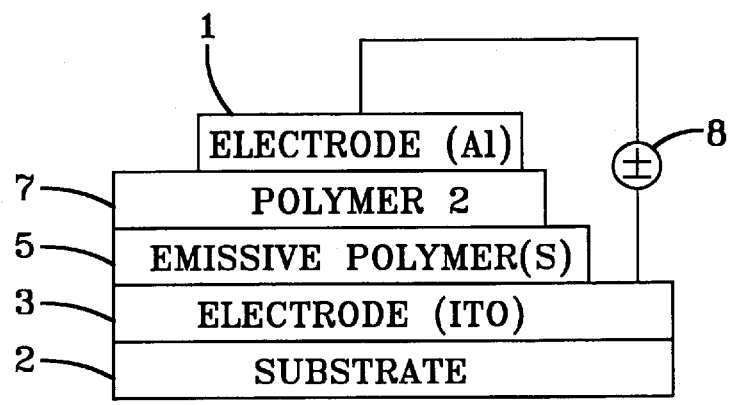

In accordance with the foregoing summary of the invention, the following describes preferred embodiments of the present invention which are presently considered to be the best mode of the invention.

In describing the preferred embodiments of the invention which is illustrated in the drawings, specific terminology is resorted to for the sake of clarity. However, it is not intended that the invention be limited to the specific terms so selected and it is to be understood that each specific term includes all technical equivalents that operate in a similar manner to accomplish a similar purpose.

EXAMPLE 1

Figure 5:
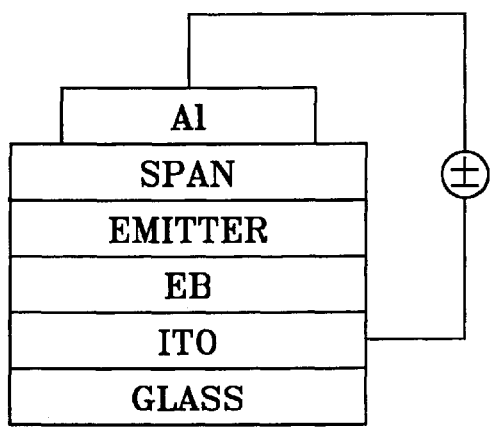
FIG. 5 is a general schematic of a particular color variable bipolar light emitting device in accordance with one embodiment of the present invention, as described below.

In this example, a color-variable light emitting device described schematically in FIG. 5 comprises a copolymer of poly (pyridyl vinylene) and poly (phenylene vinylene) derivative, PPyVPV, and a copolymer of polythiophene and polyphenylene derivative, PTP, were used as the emitting materials (appearing as the "Emitter" layer in FIG. 5); the emeraldine base (EB) form of polyaniline and the sulfonated form of polyaniline (SPAN) were used as the redox materials. ITO and Al were used as the electrodes. The polymer layers were formed using spin coating techniques. The EB layer was first spin-coated at about 3000 rpm onto pre-cleaned patterned ITO substrates (with a sheet resistance of 15 $\Omega/\square$) from N-methylpyrrolidinone (NMP) solution (concentration of about 5 mg/ml). The emitting layer was then spin coated over the EB layer from a blend of PPyVPv and PTP (3:2 weight ratio) in xylenes or trichloroethylene (total concentration of about 10 mg/ml). Subsequently, the SPAN layer was coated over the emitting layer from an aqueous solution. All the spin coating procedures were carried out inside a class 100 clean room. The top metal electrode was deposited by vacuum evaporation at a pressure below $10^{-6}$ torr. To prevent damage to the polymers, the substrate was mounted on a cold-water cooled surface during evaporation.

Absorption spectra were measured on spin-cast films using a Perkin-Elmer Lamda 19 UV/VIS/NIR spectrometer. Photoluminesence (PL) and EL were measured using a PTI fluorometer (Model QM-1). The current-voltage (I-V) characteristics were measured simultaneously with EL using two Keithly Model 195A multimeters while the DC voltage was applied by a Hewlett-Packard Model 6218A DC power supply. Quantun efficiency and brightness were measured using a calibrated photodiode (UDT UV100).

Figure 3:
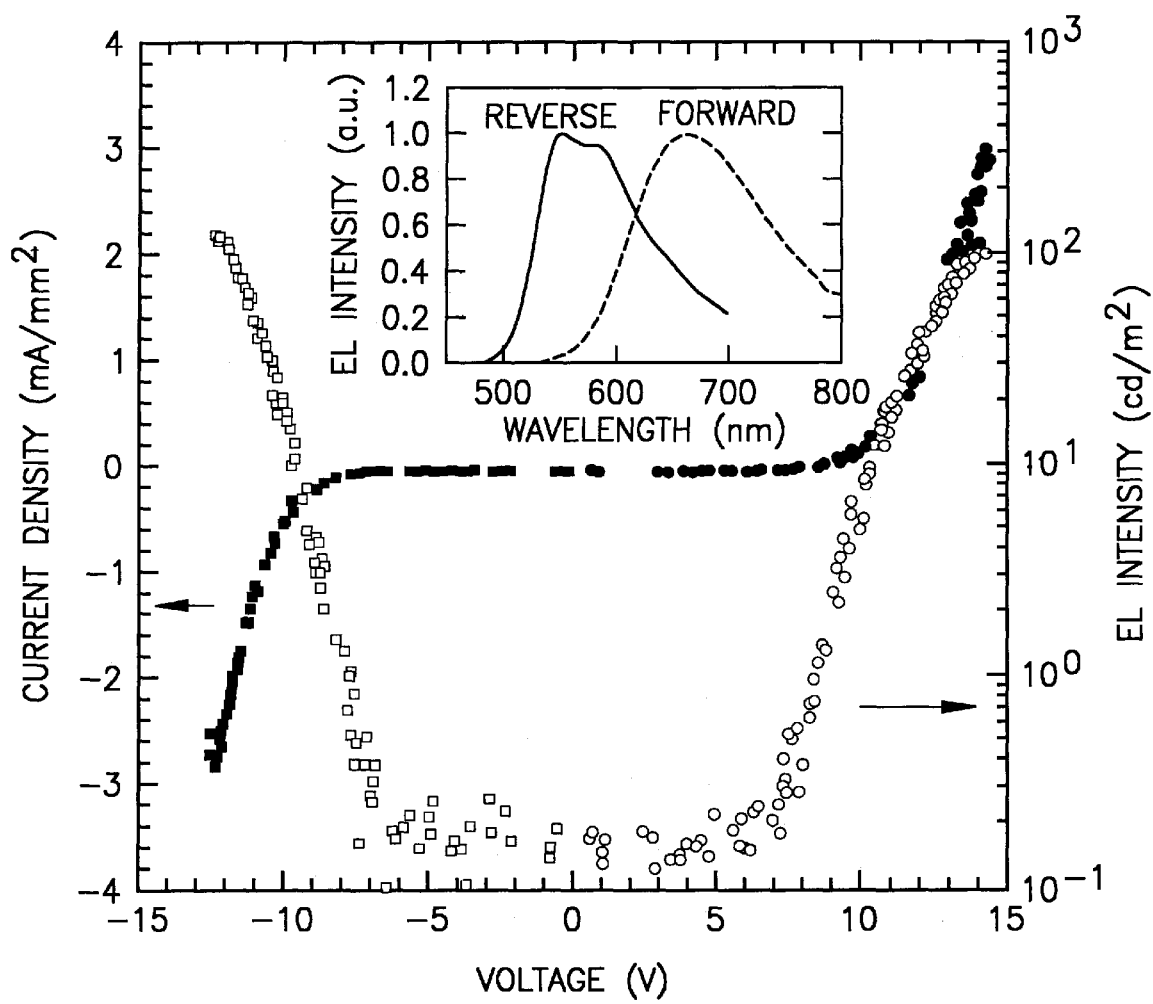
FIG. 3 is a graph showing the current/voltage/luminance characteristics and corresponding electroluminescent spectra of the same device in accordance with one embodiment of the present invention, i.e., a color variable light emitting device under forward and reverse DC bias. The inset shows operation of the device under both classical forward and reverse operation.

FIG. 3 shows the typical current-voltage (I-V) and luminance-voltage characteristics of the multi-layer devices. The devices have typical turn on voltages of about 4–8 V, depending on film thickness, and work equally well under both polarities of driving voltage with red light being emitted under forward bias and green light being emitted under reverse bias. The emitted light was clearly visible under normal indoor lighting. Internal device efficiencies of up to 0.1% photons/electron has been achieved for the initial devices. The EL spectra under forward and reverse bias are shown in the inset of FIG. 3. The CIE chromaticity x,y coordinates of the two colors are calculated to be (0.654, 0.345) and (0.471,0.519), respectively, showing both colors to be relatively pure. The color of the devices can be switched rapidly, up to 20 kHz, depending upon pixel impedance and geometry.

Studies on the devices of the present invention show that the red light is generated from the interface between the emitting layer and the SPAN layer under forward bias, and the green light is generated near the interface between the emitting layer and SPAN, in the bulk of the emitting layer, or at the interface between the emitting layer and the EB layer. The exact location and hence the color of the light generated can be varied by the ratio of the PPyVPV to PTP in the blend, i.e. by the overall charge transport properties of the emitting layer because the first polymer, e.g., PPyVPV, has improved electron transport properties, and the second polymer, e.g., PTP, has better hole transport properties.

The devices work under either polarity of driving voltage with different colors of light being emitted from different locations, red light from the emitting polymer/SPAN interface under forward bias, and green light emitting from the bulk of the emitting polymers under reverse bias. Electroluminescence of the devices peak at 550 nm with a shoulder at 585 nm under reverse bias while they show a single peak at 665 nm under forward bias. The relative fast time response allows the rapid switch of colors and AC operation.

Figure 6:
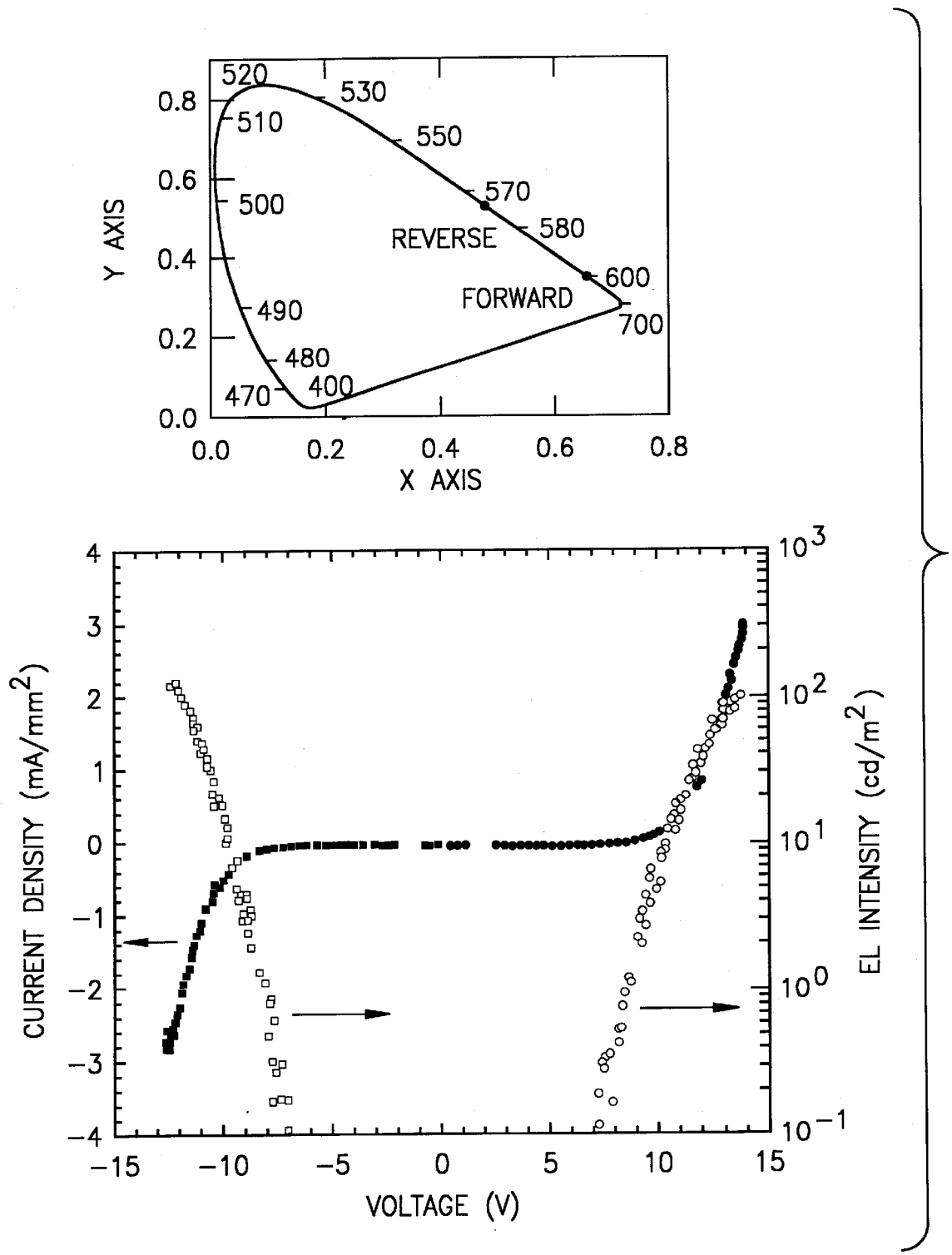
FIG. 6 is a graph showing the current-voltage and light-voltage characteristics of a color variable light-emitting device under forward and reverse bias conditions; the inset shows the colors of the device under forward and reverse bias in the CIE chromaticity diagram.

FIG. 6 is similar to FIG. 3 with the exception of the inset, showing both colors to be relatively pure.

Figure 7:
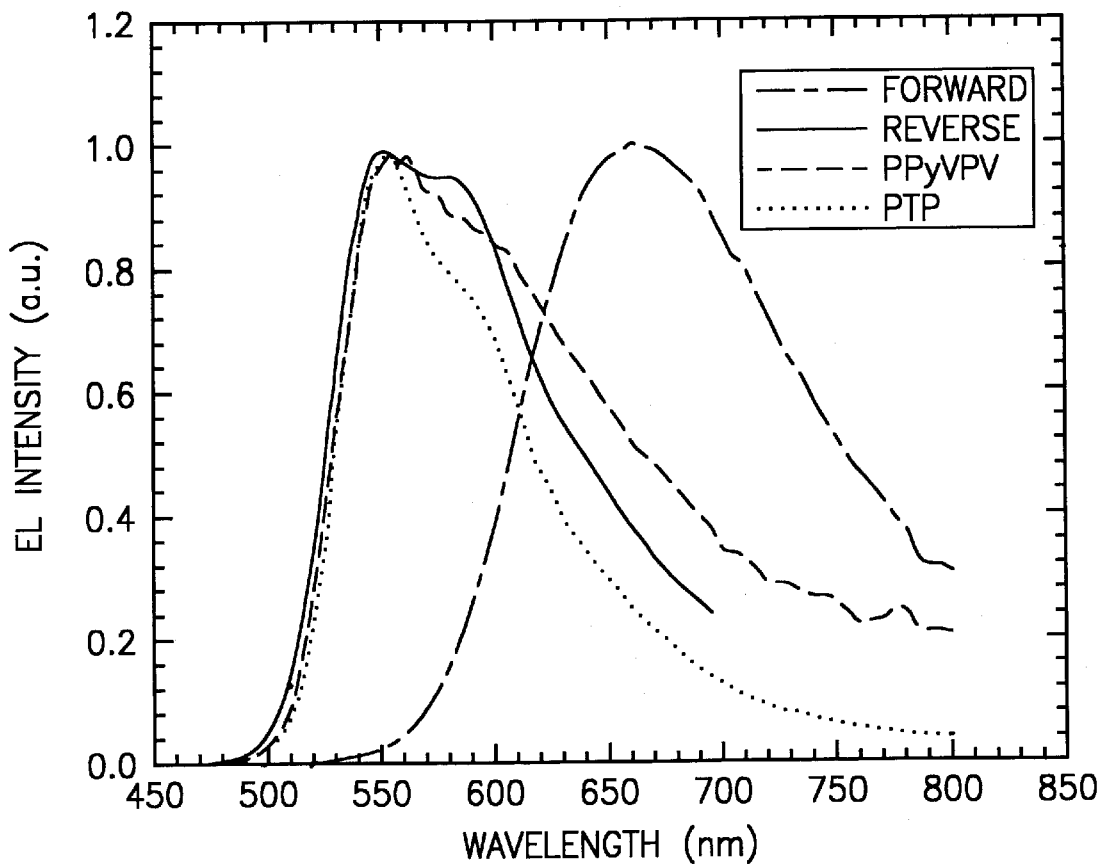
FIG. 7 is a graph showing the electroluminescent spectra of a multiple layer color variable light emitting device under forward and reverse DC bias, in accordance with one embodiment of the present invention. Also shown are corresponding electroluminescent spectra of the component polymers of the emitting layer.

As shown in FIG. 7, the EL spectra under forward bias is substantially different from that of the single layer devices of either PPyVPV or PTP suggesting that the light is generated from the interface between the emitter blend and either EB or SPAN under forward bias. To further elucidate this effect, the following devices were fabricated: ITO/PPyVPV/Al; ITO/SPAN/PPpVPV/Al; ITO/PPyVPV/SPAN/Al; ITO/SPAN/PPyVPV/SPAN/Al and similar devices replacing SPAN with EB. All of these devices were fabricated and tested under similar conditions in forward bias. Among all these devices, only ITO/PPyVPV/SPAN/Al and ITO/SPAN/PPyVPV/SPAN/Al show dramatically redshifted EL. This clearly demonstrates that the red light is generated from the PPyVPV/SPAN interface on the cathode side under forward bias. Similar studies using PTP as the emitting layer show that the emission properties of PTP are not affected significantly by the presence of the SPAN layer.

The EL spectra of the color variable device under reverse bias are similar to those of the single layer PPyVPV and PTP devices implying that the light is generated either in the bulk of the emitting polymer or at the EB interface. We are not able to identify the emission zone exactly because the EB layer does not modify the emission properties of the emitting polymer. The EB layer functions as a charge injection enhancement layer, playing a similar role as it does in symmetrically configured AC light-emitting (SCALE) devices reported earlier. Under reverse bias, the SPAN layer on the cathode side plays a similar role.

Figure 8:
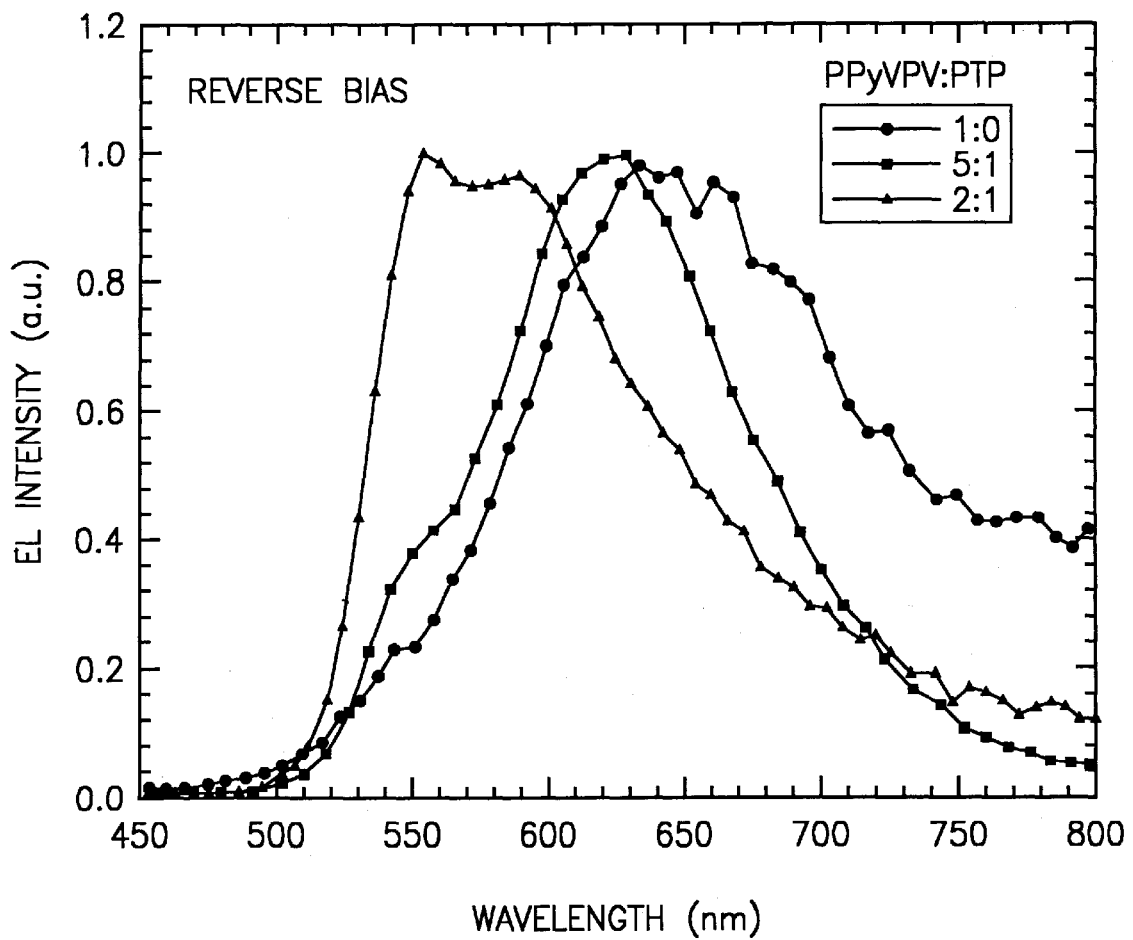
FIG. 8 is a graph showing the electroluminescent spectra of a multiple layer color variable light emitting device under reverse DC bias, in accordance with one embodiment of the present invention, and showing the variability in color dependent upon the ratio of the polymer blend in the emissive layer.

It is noted that when the blend in the color variable devices is replaced by pure PPyVPV polymers, the devices emit red light in forward bias and red-orange light in reverse bias. This indicates that, under reverse bias, the light is still generated near PPyVPV/SPAN interfaces. This can be understood in terms of different electron and hole transport properties of the PPyVPV and PTP polymers. Most conjugated polymers, including poly(phenylene vinylene) (PPV) poly(p-phenylene) (PPP) and polythiophene, have better hole than electron transport properties. The addition of a high electronegativity unit, pyridine, to the backbone is expected to improve the electron transport properties. Therefore, under reverse bias the light is still generated near the SPAN interface for the ITO/EB/PPyVPV/SPAN/Al device. By adding PTP, which is expected to have better hole transport properties, to PPyVPV, the overall hole transport properties of the blend is improved, and hence the light is generated away from the SPAN interface for the ITO/EB/Blend/SPAN/Al device under reverse bias, emitting green light. In fact, a gradual EL spectra shift toward green has been observed for the devices with increasing concentration of PTP in the blend, as shown in FIG. 8.

Figure 9:
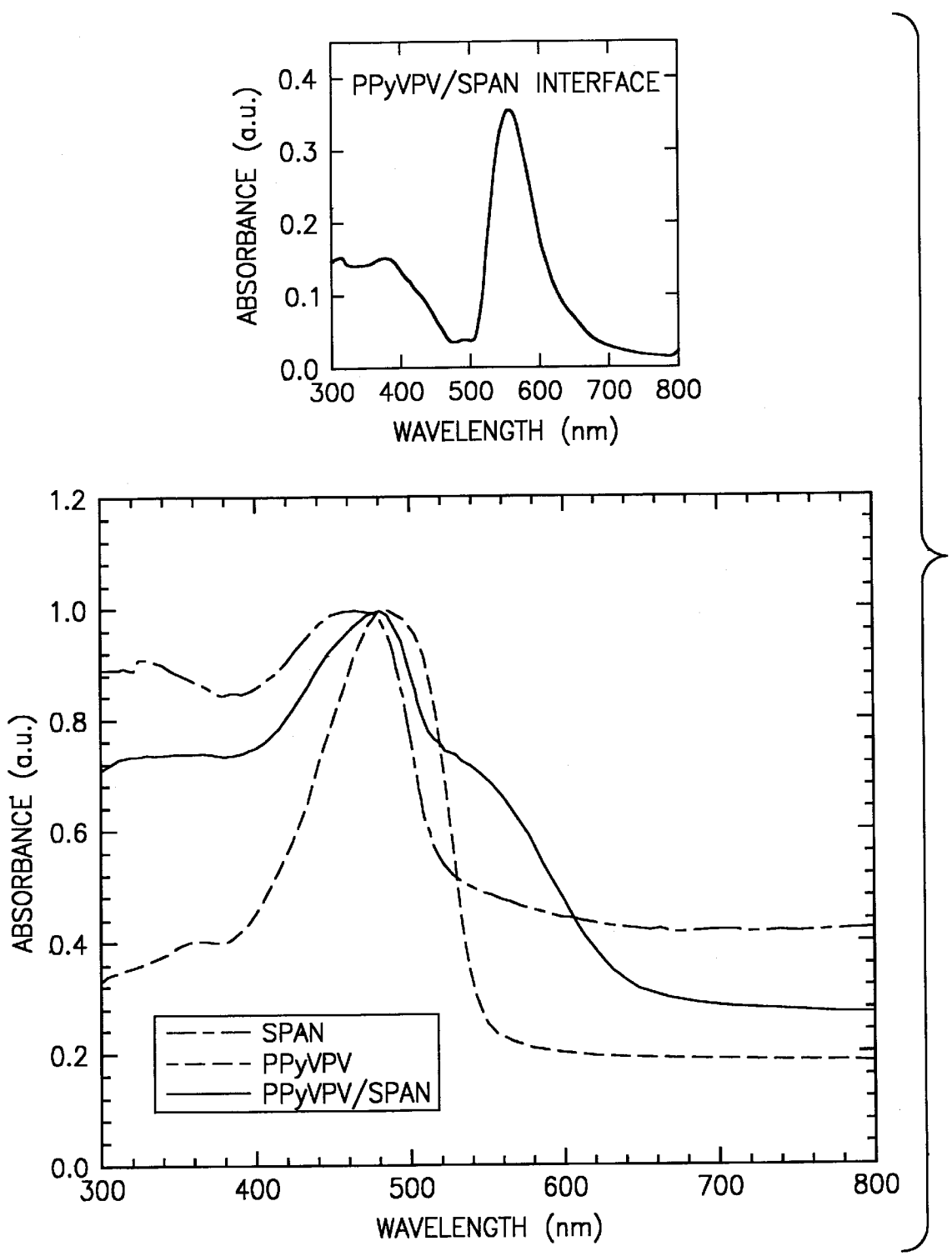
FIG. 9 is a graph showing an absorbance spectra from a PPyVPV film spin cast from aqueous solution, and a bilayer of PPyVPV/SPAN; inset: absorbance spectra as a result of the subtraction of the absorbance of each individual layer from that of the bilayer.

Initial studies suggest the formation of new emissive species due to protonation of the pyridyl units by SPAN. This species was identified by both absorption and PL experiments. FIG. 9 shows the absorbance spectra of a PPyVPV layer, a SPAN layer, and a bilayer of PPyVPV/SPAN. SPAN is a self doped, water soluble conducting polymer with a room temperature conductivity of $10^{-2}$ S/cm. It has a wide optical window from green to near IR. PPyVPV has an absorption band peaked around 480 nm. An extra feature to the absorption at the interface is clearly shown in the inset of FIG. 9 as a result of subtraction of the absorbance of each individual layers from that of the bilayer. The interface absorption might be attributed to the new species as a result of protonation of PPyVPV by SPAN. One special feature to SPAN is that it is acidic in aqueous solution and it is often called polyaniline sulfonic acid. On the other hand, the pyridyl unit is known to be susceptible to protonation or quarternization by acid. To further clarify this, the same absorption experiment was performed on the films with the same configurations as above but replacing the SPAN with toluene sulfonic acid (TSA). An almost identical absorbance feature to the PPyVPV/SPAN was found in the PPyVPV/TSA bilayer, consistent with the new species at the PPyVPV/SPAN interface originating from the protonated pyridyl units. The new species are emissive and emit redshifted light as compared to non protonated polymer.

The color variable light-emitting devices described above have a number of important advantages:

(1) the two redox polymers modify the charge injection properties of the polymer/metal interfaces which allows the use of high work function metals as electrodes. This reduces the aging problems associated with "conventional" polymer LEDs which must use reactive low work function metals to achieve efficient electron injection;

(2) the introduction of the two redox polymers allows the devices to operate in both forward and reverse bias. Since no ionic species are involved directly in the device operation, the colors can be switched very rapidly, in sharp contrast to intrinsically slow response LECs.

(3) the emission zone is confined in between the two emitting polymer/redox polymer interfaces which is away from the electrodes avoiding the EL quenching effects near the metal electrodes; and (4) the emitting polymers are protected by the redox polymers against direct exposure to air, potentially improving the device stability.

EXAMPLE 2

Another approach to the color variable light-emitting device is represented by single layer devices in which blends of two or more emitting materials with different emissive and charge transport properties are used as emitting layers. Sometimes, one or more non-emissive materials may be needed to control the overall properties of the emitting layer.

Figure 4:
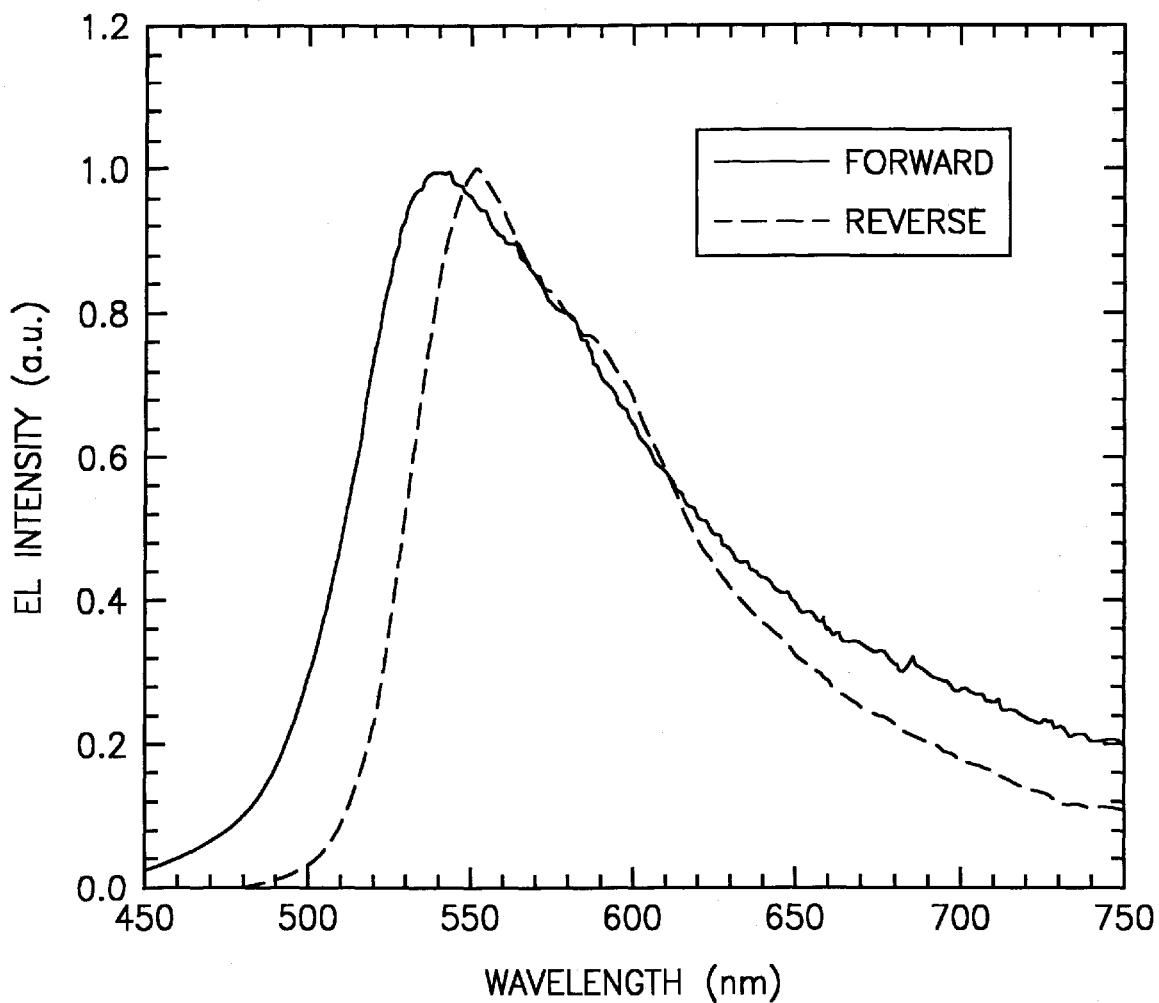
FIG. 4 is a graph showing the electroluminescent spectra of a single layer color variable light emitting device under forward and reverse DC bias, in accordance with one embodiment of the present invention.

For an example of the single layer devices, a blend of the PPyV and PTP was used as the emitting layer; ITO and Al were used as electrodes. The emitting layer was formed by spin casting at 2000 rpm from solution in xylenes or trichloroethylene onto precleaned ITO substrate. An aluminum electrode was then deposited by vacuum evaporation at a pressure below $10^{-6}$ torr. FIG. 4 shows the EL spectra of a single layer device under forward and reverse bias. Different colors of light were generated under forward and reverse bias, although the color difference is smaller than that of the multi-layer device.

EXAMPLE 3

Figure 2:
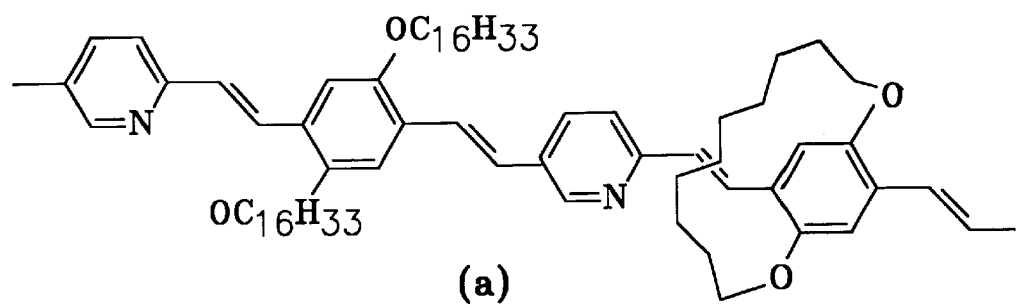
FIG. 2 shows the chemical structure of the repeating units of polymers that may be used in accordance with one embodiment of the present invention.
Figure 2:
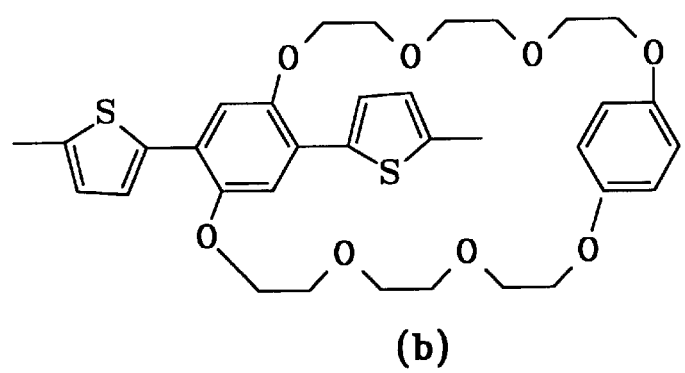
Figure 2:
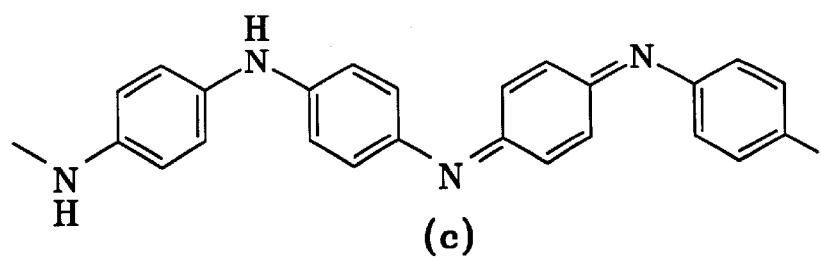
Figure 2:
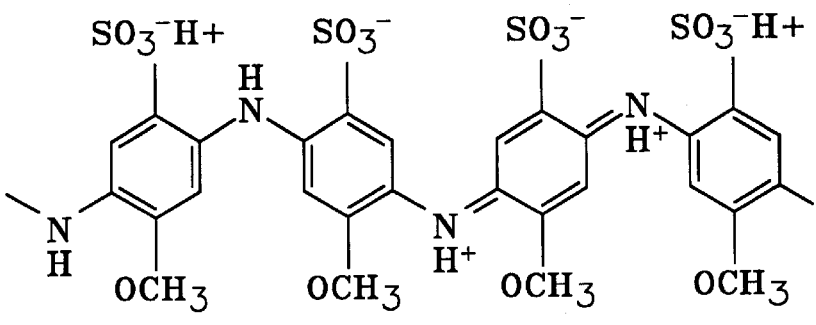

The device of Example 1 was fabricated without layer 6, and wherein the polyaniline layer 7 comprises SPAN, and the emissive layer is a blend of the $PP_yVPV$ shown in FIG. 2(a) and the PTP shown in FIG. 2(b).

The concept of the color switchable light-emitting devices described here is quite general, it can be applied to a variety of EL polymers in conjunction with suitable redox polymers. By including the blue emitters in the blend, color variable devices which generate other colors (including blue) are possible.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, so as to be able to practice the present invention without departing from its spirit as reflected in the appended claims. It is the intention, therefore, to limit the invention only as indicated by the scope of the claims, the text of which is incorporated herein by reference.

What is claimed is:

1. A color-variable electroluminescent device comprising:
    (a) a polymeric layer adapted to act as a light emitting layer, said polymeric layer comprising a blend of at least two emissive polymers having different emissive and charge transport properties such that said blended polymeric layer is capable of conducting current in opposing directions; and
    (b) two electrodes disposed respectively on either side of said polymeric layer, said polymeric layer being in electrical contact with said electrodes so as to be capable of producing a color variable light emission upon a current being passed in different directions through said polymeric layer, said color of said light emission dependent upon said direction of said current.

2. An electroluminescent device according to claim 1 wherein said polymeric layer comprises a blend of polymers selected from the group consisting of conjugated polymers and copolymers.

3. An electroluminescent device according to claim 1 wherein said polymeric layer comprises a polymer selected from the group consisting of polypyridines, polypyridylvinylenes, polythiophenes, polyphenylenes, polyphenylenevinylenes, polyphenylenebenzobisthiazoles, polyfluorenes, polyvinylcarbazoles, polyacetylenes and polythienylenevinylenes.

4. An electroluminescent device according to claim 1 wherein said polymeric layer comprises a blend of poly (pyridyl vinylene/phenylene vinylene) and poly(phenylene/thiophene).

5. An electroluminescent device according to claim 1 wherein a said electrode comprises a material selected from the group consisting of aluminum and indium-tin-oxides.

6. An electroluminescent device according to claim 1 additionally comprising a source of a direct electric current supplied to said electrodes.

7. An electroluminescent device according to claim 1 additionally comprising a source of an alternating electric current supplied to said electrodes.

8. A color-variable electroluminescent device comprising:
    (a) a first non-emissive polymeric layer;
    (b) a second non-emissive polymeric layer;
    (c) an intermediate polymeric layer adapted to act as a light emitting layer and disposed between said first non-emissive polymeric layer and said second non-emissive polymeric layer and capable of conducting current in opposing directions, at least one of said non-emissive polymer layers adapted to modify the emission properties of said intermediate polymeric layer such that an interface between said light emitting layer and said at least one non-emissive polymer layer is adapted to emit light of a different color than said light emitting layer; and (d) two electrodes in electrical contact respectively with said first non-emissive polymeric layer and said second non-emissive polymeric layer, said intermediate polymeric layer being in electrical contact with said first non-emissive polymeric layer and said second non-emissive polymeric layer so as to be capable of producing a color-variable light emission upon a current being passed in different directions through said intermediate polymeric layer, said color of said light emission dependent upon said direction of said current.

9. An electroluminescent device according to claim 8 wherein said intermediate polymeric layer comprises a blend of polymers selected from the group consisting of conjugated polymers and copolymers.

10. An electroluminescent device according to claim 8 wherein said intermediate polymeric layer comprises a blend of poly(pyridyl vinylene/phenylene vinylene) and poly (phenylene/thiophene).

11. An electroluminescent device according to claim 8 wherein said polymeric layer comprises a polymer selected from the group consisting of polypyridines, polypyridylvinylenes, polythiophenes, polyphenylenes, polyphenylenevinylenes, polyphenylenebenzobisthiazoles, polyfluorenes, polyvinylcarbazoles, polyacetylenes and polythienylenevinylenes.

12. An electroluminescent device according to claim 8 wherein a said electrode comprises a material selected from the group consisting of aluminum and indium-tin-oxides.

13. An electroluminescent device according to claim 8 additionally comprising a source of a direct electric current supplied to said electrodes.

14. An electroluminescent device according to claim 8 additionally comprising a source of an alternating electric current supplied to said electrodes.

15. An electroluminescent device according to claim 8 wherein said first non-emissive polymeric layer comprises a material selected from the group consisting of emeraldine base polyaniline, oligomers of emeraldine base polyaniline, sulfonated polyaniline, oligomers of sulfonated polyaniline, and mixtures thereof.

16. An electroluminescent device according to claim 8 wherein said second non-emissive polymeric layer comprises a material selected from the group consisting of emeraldine base polyaniline, oligomers of emeraldine base polyaniline, sulfonated polyaniline, oligomers of sulfonated polyaniline, and mixtures and ring-substituted derivatives thereof.

17. An electroluminescent device according to claim 8 wherein said intermediate polymeric layer comprises polymers selected from the group consisting of both copolymers and oligomers of both conjugated polymers and non-conjugated polymers.

18. An electroluminescent device according to claim 8 wherein said intermediate polymeric layer comprises at least one molecular dopant.

19. A color-variable electroluminescent device comprising:

(a) a non-emissive polymeric layer;

(b) two electrodes, a first electrode in electrical contact with said non-emissive polymeric layer, and a second electrode; and (c) an intermediate polymeric layer comprising a blend of at least two emissive polymers having different emissive and charge transport properties, said intermediate polymer layer adapted to act as a light emitting layer and disposed between said non-emissive polymeric layer and said second electrode and capable of conducting current in opposing directions, said intermediate polymeric layer being in electrical contact with said non-emissive polymeric layer so as to be capable of producing a color-variable light emission upon a current being passed in different directions through said intermediate polymeric layer, said color of said light emission dependent upon said direction of said current.

20. An electroluminescent device according to claim 19 wherein said intermediate polymeric layer comprises a blend of polymers selected from the group consisting of conjugated polymers and copolymers.

21. An electroluminescent device according to claim 19 wherein said intermediate polymeric layer comprises a blend of poly(pyridyl vinylene/phenylene vinylene) and poly (phenylene/thiophene).

22. An electroluminescent device according to claim 19 wherein said polymeric layer comprises a polymer selected from the group consisting of polypyridines, polypyridylvinylenes, polythiophenes, polyphenylenes, polyphenylenevinylenes, polyphenylenebenzobisthiazoles, polyfluorenes, polyvinylcarbazoles, polyacetylenes and polythienylenevinylenes.

23. An electroluminescent device according to claim 19 wherein a said electrode comprises a material selected from the group consisting of aluminum and indium-tin-oxides.

24. An electroluminescent device according to claim 19 additionally comprising a source of a direct electric current supplied to said electrodes.

25. An electroluminescent device according to claim 19 additionally comprising a source of an alternating electric current supplied to said electrodes.

26. An electroluminescent device according to claim 19 wherein said non-emissive polymeric layer comprises a material selected from the group consisting of emeraldine base polyaniline, oligomers of emeraldine base polyaniline, sulfonated polyaniline, oligomers of sulfonated polyaniline, and mixtures and ring-substituted derivatives thereof.

27. An electroluminescent device according to claim 19 wherein said intermediate polymeric layer comprises polymers selected from the group consisting of both copolymers and oligomers of both conjugated polymers and non-conjugated polymers.

28. An electroluminescent device according to claim 19 wherein said intermediate polymeric layer comprises at least one molecular dopant.

* * * * *